US008749027B2

(12) United States Patent
Chen et al.

(10) Patent No.: US 8,749,027 B2
(45) Date of Patent: Jun. 10, 2014

(54) ROBUST TSV STRUCTURE (75) Inventors: Hsien-Wei Chen, Sinying (TW);
Shin-Puu Jeng, Hsinchu (TW);
Hung-Jung Tu, Hualien (TW);
Wen-Chih Chiou, Toufen (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 194 days.

(21) Appl. No.: 12/349,901

(22) Filed: Jan. 7, 2009

(65) Prior Publication Data
US 2010/0171203 A1  Jul. 8, 2010

(51) Int. Cl.
*H01L 23/544* (2006.01)
*H01L 29/40* (2006.01)

(52) U.S. Cl.
USPC ............................ 257/620; 257/621; 257/758

(58) Field of Classification Search
USPC ......................................... 257/620, 758, 621
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 * | 9/2002 | Rao et al. ....................... 438/598 |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 * | 4/2006 | Chudzik et al. ............... 257/700 |
| 7,049,170 B2 | 5/2006 | Savastiouk et al. |
| 7,060,601 B2 * | 6/2006 | Savastiouk et al. ........... 438/584 |
| 7,071,546 B2 | 7/2006 | Fey et al. |

(Continued)

FOREIGN PATENT DOCUMENTS

| | | |
|---|---|---|
| CN | 101290912 | 10/2008 |
| JP | 2005167198 | 6/2005 |
| JP | 2007073775 | 3/2007 |
| JP | 2007123857 A | 5/2007 |

OTHER PUBLICATIONS

Japanese Office Action issued on Aug. 21, 2012, with English Translation.

(Continued)

*Primary Examiner* — Ori Nadav
(74) *Attorney, Agent, or Firm* — Lowe Hauptman & Ham, LLP (57) ABSTRACT

A die includes a seal-ring structure below a substrate. The seal-ring structure is disposed around at least one substrate region. At least one means for substantially preventing ion diffusion into the substrate region. The at least one means is coupled with the seal-ring structure.

23 Claims, 7 Drawing Sheets

(56) References Cited

U.S. PATENT DOCUMENTS

| | | |
|---|---|---|
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,633,167 B2 * | 12/2009 | Kawano et al. ............... 257/774 |
| 7,696,607 B2 * | 4/2010 | Sano et al. .................... 257/620 |
| 7,759,798 B2 * | 7/2010 | Chibahara et al. ............ 257/758 |
| 8,476,735 B2 * | 7/2013 | Hsu et al. ....................... 257/528 |
| 8,487,444 B2 * | 7/2013 | Law et al. ....................... 257/774 |
| 2003/0199123 A1 * | 10/2003 | Siniaguine .................... 438/118 |
| 2004/0014308 A1 | 1/2004 | Kellar et al. |
| 2004/0119166 A1 | 6/2004 | Sunohara |
| 2005/0139954 A1 | 6/2005 | Pyo |
| 2006/0216857 A1 * | 9/2006 | Zhao ............................. 438/106 |
| 2007/0001308 A1 * | 1/2007 | Takemura et al. ............ 257/758 |
| 2007/0069364 A1 * | 3/2007 | Kawano et al. ............... 257/698 |
| 2008/0142990 A1 | 6/2008 | Yu et al. |
| 2008/0220565 A1 | 9/2008 | Hsu et al. |
| 2008/0258266 A1 * | 10/2008 | Takemura et al. ............ 257/620 |
| 2009/0121321 A1 * | 5/2009 | Miccoli et al. ................ 257/618 |

OTHER PUBLICATIONS

Office Action dated Dec. 11, 2012 from corresponding application No. JP 2010-000893.

Office Action dated Dec. 18, 2012 from corresponding application No. CN200910221560.9.

Office Action dated Dec. 24, 2012 from corresponding application No. TW098145263.

* cited by examiner

ROBUST TSV STRUCTURE

FIELD OF THE INVENTION

The present disclosure relates generally to the field of semiconductor devices, and more particularly, to dies, stacked structures, and systems.

BACKGROUND OF THE INVENTION

Since the invention of the integrated circuit, the semiconductor industry has experienced continual rapid growth due to continuous improvements in the integration density of various electronic components (i.e., transistors, diodes, resistors, capacitors, etc.). For the most part, this improvement in integration density has come from repeated reductions in minimum feature size, allowing for the integration of more components into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limits to the density that can be achieved in two dimensions. One of these limits is the minimum size needed to make these components. Also, when more devices are put into one chip, more complex designs are required.

An additional limitation comes from the significant increase in the number and length of interconnections between devices as the number of devices increases. When the number and length of interconnections increase, both circuit resistance-capacitance (RC) delay and power consumption increase.

Three-dimensional integrated circuits (3D IC) are therefore created to resolve the above-discussed limitations. In a conventional formation process of 3D IC, two wafers, each including an integrated circuit, are formed. The wafers are then bonded with the devices aligned. Deep vias are then formed to interconnect devices on the first and second wafers.

Much higher device density has been achieved using 3D IC technology, and up to six layers of wafers have been bonded. As a result, the total wire length is significantly reduced. The number of vias is also reduced. Accordingly, 3D IC technology has the potential of being the mainstream technology of the next generation.

Conventional methods for forming 3D IC also include die-to-wafer bonding, wherein separate dies are bonded to a common wafer. An advantageous feature of the die-to-wafer bonding is that the size of the dies may be smaller than the size of chips on the wafer.

Recently, through-silicon-vias (TSVs), also referred to as through-wafer vias, are increasingly used as a way of implementing 3D IC. Conventionally, a bottom wafer is bonded to a top wafer. Both wafers include integrated circuits over substrates. The integrated circuits in the bottom wafer are connected to the integrated circuits in the wafer 4 through interconnect structures. The integrated circuits in the wafers are further connected to external pads through through-silicon-vias. The stacked wafers can be subjected to a sawing process to provide a plurality of stacked die structures.

SUMMARY OF THE INVENTION

In one embodiment, a die includes a seal-ring structure below a substrate. The seal-ring structure is disposed around at least one substrate region. At least one means for substantially preventing ion diffusion into the substrate region is coupled with the seal-ring structure.

In another embodiment, a stacked structure includes a first die electrically coupled with a second die. The first die includes a first seal-ring structure below a first substrate. The first seal-ring structure is disposed around at least one first substrate region. At least one first means for substantially preventing ion diffusion into the first substrate region is coupled with the first seal-ring structure.

In the other embodiment, a system includes a stacked structure electrically coupled with a substrate board. The stacked structure includes a first die electrically coupled with a second die. The first die includes a first seal-ring structure below a first substrate. The first seal-ring structure is disposed around at least one first substrate region. At least one first means for substantially preventing ion diffusion into the first substrate region is coupled with the first seal-ring structure.

These and other embodiments of the present invention, as well as its features are described in more detail in conjunction with the text below and attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE INVENTION

As noted, the conventional stacked wafers can be subjected to a sawing process along scribe lines on the wafers. The substrates upon which the integrated circuits are formed are merely thinned substrates. It is found that the sawing process can generate ions and/or cracks on the scribe lines. The ions can diffuse into the substrates and/or the cracks can penetrate into the substrates to damage the integrated circuits formed on the substrate.

From the foregoing, structures and fabrication methods for dies and stacked die structures are desired.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the invention relate to dies and stacked structures and systems including the dies. At least one of the die can include at least one means, such as a via structure, through-silicon-via structure, trench, plug, other structure, and/or combinations, for substantially preventing ion diffusion and/or crack penetration into a substrate region of the die during a die sawing. Following are descriptions of various exemplary embodiments of the present invention. The scope of the invention is not limited thereto.

Figure 1A:
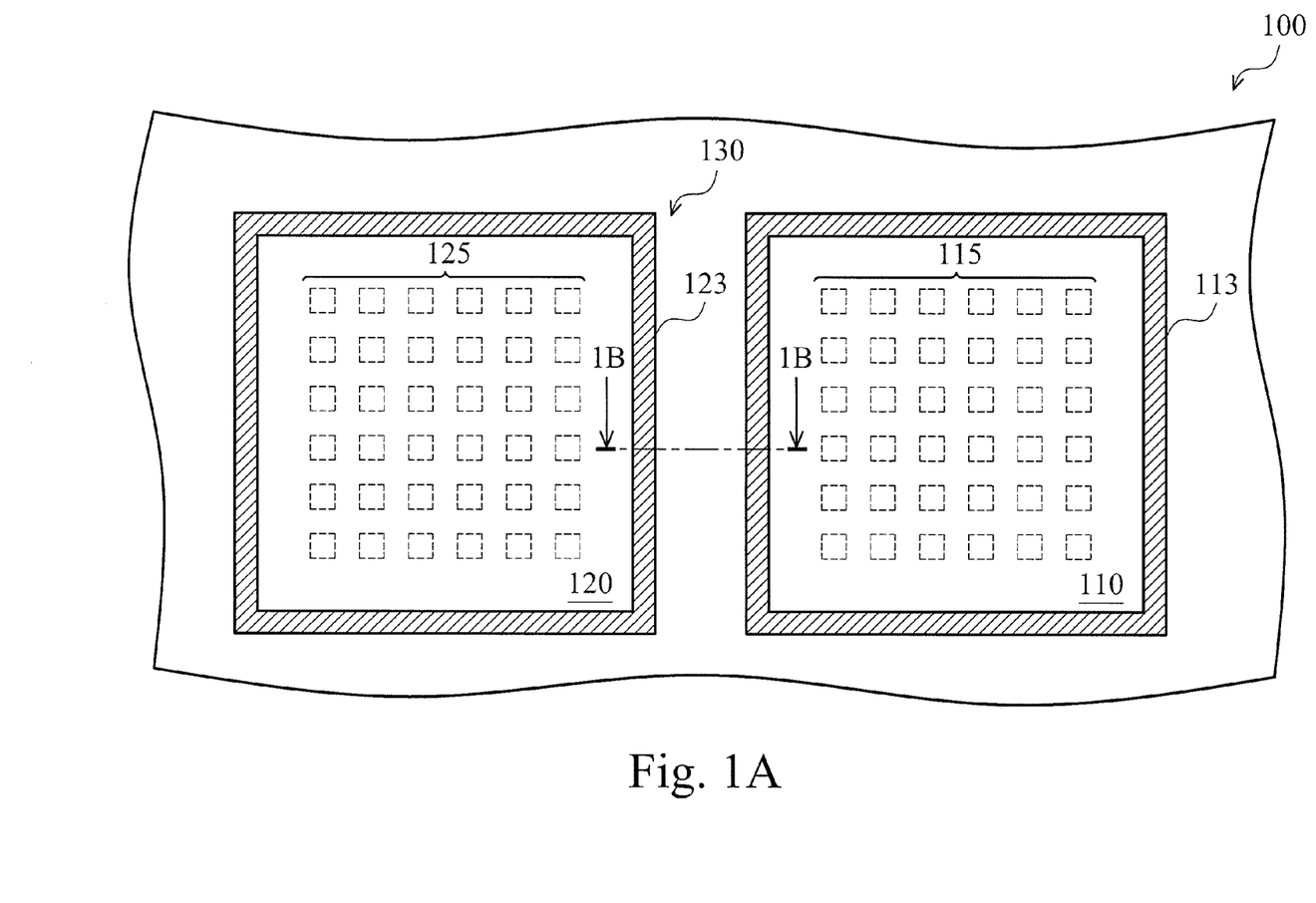
FIG. 1A is a schematic drawing showing a top view of a portion of an exemplary wafer.

FIG. 1A is a schematic drawing showing a top view of a portion of an exemplary wafer. In FIG. 1A, a wafer portion 100 can include a plurality of dies 110 and 120. The die 110 can be spaced from the die 120 by a scribe line 130. During die sawing, a saw (not shown) can saw the wafer portion 100 along the scribe line 130. The dies 110 and 120 can have seal-ring structures 113 and 123, respectively. Each of the seal-ring structures 113 and 123 can be around at least one chip. In embodiments, the seal-ring structures 113 and 123 can be around die regions having a plurality of through-silicon-vias (TSVs) 115 and 125, respectively.

Figure 1B:
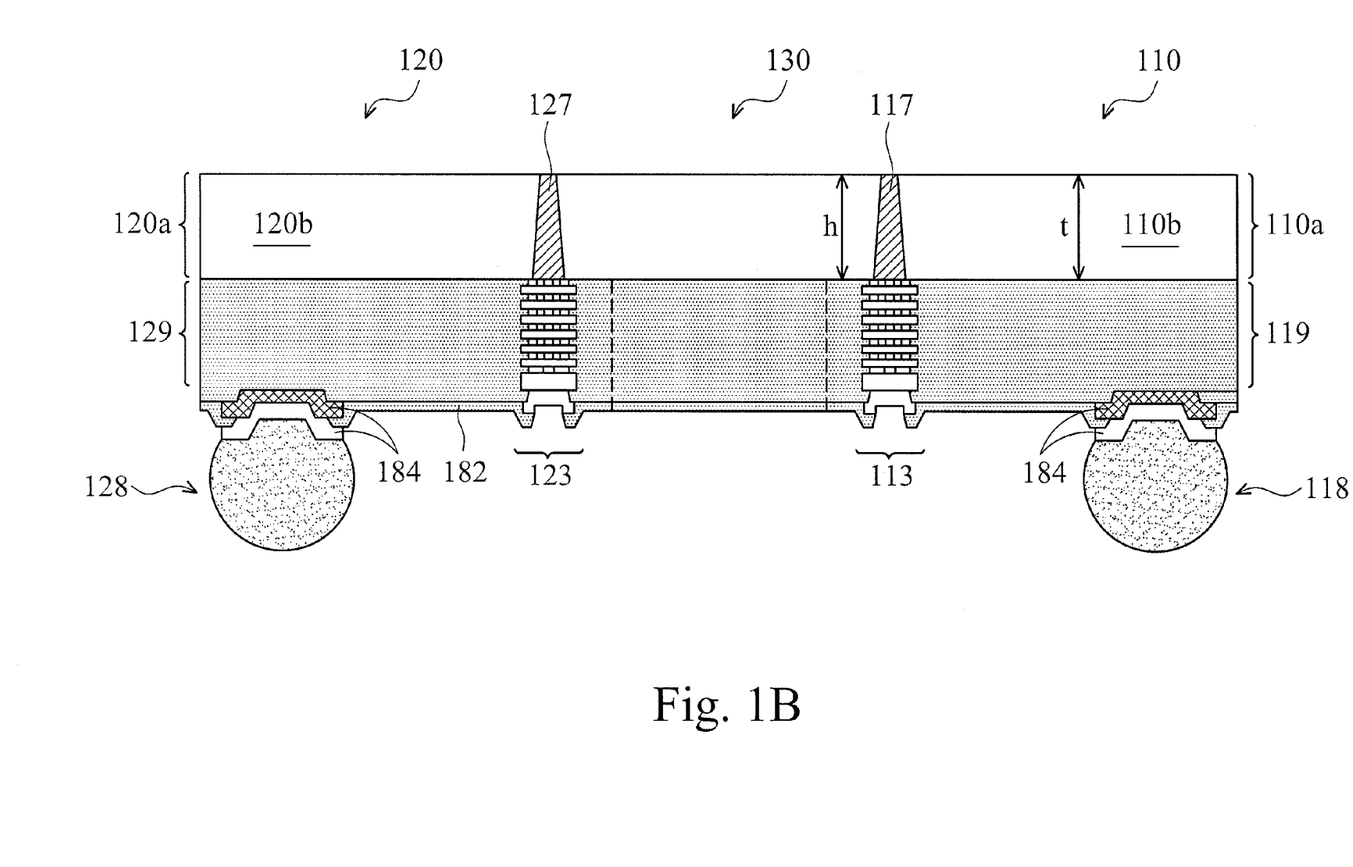
FIG. 1B is a cross-sectional view of the wafer portion taken along the line 1B-1B of FIG. 1A.

FIG. 1B is a cross-sectional view of the wafer portion taken along the line 1B-1B of FIG. 1A. In FIG. 1B, the dies 110 and 120 can include substrates 110a and 120a, respectively. The substrates 110a and 120a can be over interconnect structures 119 and 129, which include seal-ring structures 113 and 123, respectively. The interconnect structures 119 and 129 can be coupled with bump structures 118 and 128, respectively. The substrates 110a and 120a can have at least one means 117 and 127, respectively. The at least one means 117 and 127 can be coupled with the seal-ring structures 113 and 123 for substantially preventing ions diffusing into substrate regions 110b and 120b of the dies 110 and 120, respectively. During a die sawing, the means 117 and 127 can substantially prevent a crack penetration from the scribe line 130 into the substrate regions 110b and 120b.

In embodiments, the means 117 can include a TSV structure. The TSV structure can include dielectric (e.g., oxide, nitride, oxynitride, other dielectric material, and/or combinations thereof, barrier material (e.g., titanium, titanium-nitride, tantalum, tantalum-nitride, other barrier material, and/or combinations thereof), conductive material (aluminum, copper, aluminum-copper, polysilicon, other conductive material, and/or combinations thereof), other material that is suitable for forming the TSV structure, and/or combinations thereof. In embodiments, the means 117 and the TSVs 115 can be formed by the same process.

The means 117 and/or 127 for substantially preventing ion diffusion can include at least one via structure, through-silicon-via (VST) structure, trench structure, plug, other structure that is capable of substantially preventing ion diffusion, and/or combinations thereof. The top view of the means 117 and/or 127 can be round, oval, rectangular, triangular, hexangular, octangular, other suitable shape, and/or combinations thereof. In other embodiments, the means 117 can have a height "h" of about a half of a thickness "t" of the substrate 110a or more. In still other embodiments, the means 117 can be through the substrate 110a. The height "h" of the means 117 can be the same as the thickness "t" of the substrate 110a.

The means 117 can be coupled with the seal-ring structure 113. For example, the means 117 can be directly or indirectly coupled with the seal-ring structure 113. In embodiments, the means 117 can directly contact the seal-ring structure 113 as shown in FIG. 1B. In other embodiments, the means 117 can be spaced from the seal-ring structure 113 by a portion of the substrate region 110b, insulation structure (e.g., dielectric), other material that is capable of cooperating with the means 117 for substantially preventing ion diffusion during a die sawing, and/or combinations thereof. It is noted that the means 117 can be spaced from the seal-ring structure 113 by a distance that is desired for preventing ion diffusion and/or crack penetration resulting from a die sawing.

Referring to FIG. 1B, the substrate 110a and/or 120a can comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The interconnect structure 119 and/or 129 can include a plurality of interconnection layers spaced by a plurality of isolation layers. The interconnection layers can have a material such as copper, aluminum, tungsten, titanium, tantalum, other conductive material, and/or combinations thereof. The isolation layers can include a material such as oxide, nitride, oxynitride, low-k dielectric, ultra-low-k dielectric, other dielectric, and/or combinations. In embodiments, the interconnect structure 119 and/or 129 can include interlayer dielectric (ILD). In embodiments, devices, transistors, circuits, other semiconductor structures, and/or combinations thereof can be formed between the substrate 110a and the interconnect structure 119.

In some embodiments, the die 110 can include a passivation structure 182 and at least one pad structure 184. The passivation structure 182 can have at least one opening exposing the pad structure 184. In some embodiments, the passivation structure 182 can include at least one of a dielectric isolation layer and a polymer layer. The dielectric isolation layer can include a material such as oxide, nitride, oxynitride, other dielectric material, and/or combinations thereof. The polymer layer can include a material such as thermoplastic, thermoset, elastomer, coordination polymer, other suitable polymer, and/or combinations thereof. The bump structure 118 can be formed over the pad. In embodiments, the bump structure 118 can include a material such as a lead-free alloy (such as gold (Au) or a tin/silver/copper (Sn/Ag/Cu) alloy), a lead-containing alloy (such as a lead/tin (Pb/Sn) alloy), copper, aluminum, aluminum copper, other bump metal material, and/or combinations thereof.

The seal-ring structures 113 and 123 can be within the interconnect structures 119 and 129, respectively. The seal-ring structures 113 and 123 can protect transistors, devices, diodes, circuits, interconnect structures, and/or combinations thereof formed in the dies 110 and 120, respectively. In embodiments, the seal-ring structure 113 can include at least one seal ring as shown in FIG. 1B. An outside seal ring can be narrower than the inside seal ring. In embodiments, one side of the seal-ring structure 113 can be coupled with the surface of the substrate 110a. In other embodiments, one side of the seal-ring structure 113 can extend into the substrate 110a. In still other embodiments, one side of the seal-ring structure 113 can be spaced from the surface of the substrate 110a by a dielectric. It is noted that the number of seal rings and configuration of the seal-ring structures 117 and 127 shown in FIG. 1B are merely examples. The scope of the invention is not limited thereto.

Figures 2A, 2B, 2C, 2D:
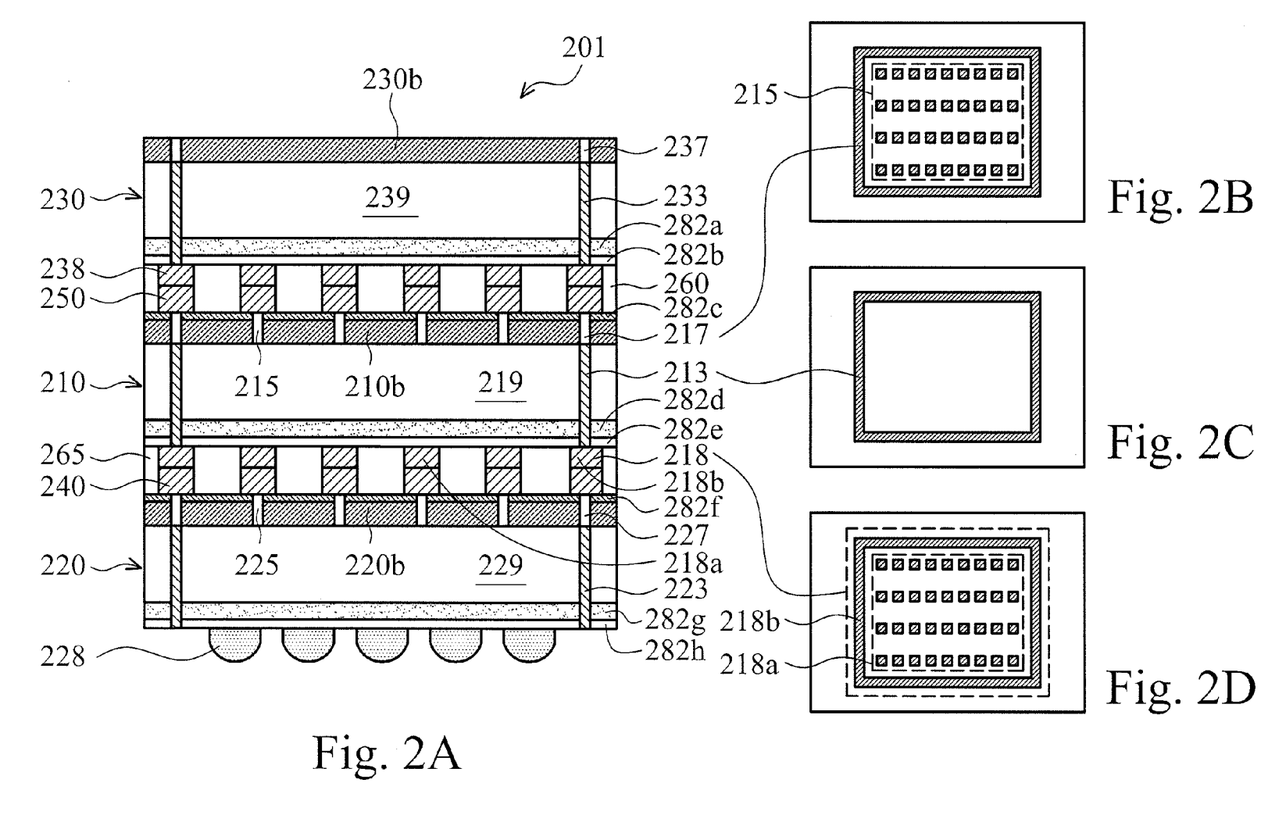
FIG. 2A is a schematic cross-sectional view of an exemplary back-to-front stacked structure.
FIGS. 2B-2D are schematic top views of exemplary TSV layer, seal-ring structure layer, and bump structure layer of the stacked structure shown in FIG. 2A.

FIG. 2A is a schematic cross-sectional view of an exemplary back-to-front stacked structure. FIGS. 2B-2D are schematic top views of exemplary TSV layer, seal-ring structure layer, and bump structure layer of the stacked structure shown in FIG. 2A. Items of FIGS. 2A-2D that are the same items in FIGS. 1A-1B are indicated by the same reference numerals, increased by 100. Items of the die 230 of FIG. 2A that are the same items in FIG. 1B are indicated by the same reference numerals, increased by 120. In embodiments, the die 230 can be a top die of the stacked structure 201 and does not include a TSV structure.

In FIG. 2A, a stacked structure 201 can include a plurality of stacked dies 210, 220, and 230. A lower surface of the die 230 has one or more passivation layers 282a and 282b; an upper surface and a lower surface of the die 210 has one or more passivation layers 282c, 282d, and 282e; and an upper surface and a lower surface of the die 220 has one or more passivation layers 282f, 282g, and 282h. The die 210 can be stacked over the die 220 and the die 230 can be stacked over the die 210. The integrated circuits of the die 210 can be electrically coupled with the integrated circuits of the die 220 through bump structures 218 and 240. The integrated circuits of the die 210 can be electrically coupled with the integrated circuits of the die 230 through bump structures 238 and 250. In embodiments, materials of the bump structures 240 and/or 250 can be similar to that of the bump structure 113 described above in conjunction with FIG. 1B.

In embodiments, underfill materials 260 and 265 can be disposed between the dies 210, 230 and dies 210, 220, respectively. For example, the underfill materials 260 and 265 can desirably prevent shorts resulting from particles falling between the dies 210, 230 and dies 210, 220. The underfill materials 260 and 265 can include a material such as resin, dielectric, other isolation material, and/or combinations thereof. In embodiment, the materials 260 and/or 265 can be saved if the particle issue is not serious. It is noted that the number of the dies of the stacked structure 201 is not limited to the drawing shown in FIG. 2A. Various numbers of the dies can be selected to form the stacked structure 201.

Referring to FIGS. 2A-2B, the means 217 for substantially preventing ion diffusion can be coupled with the seal ring structure 213, continuously extending around the TSVs 215. The means 217 and the seal-ring structure 213 can desirably prevent ions diffusion and/or crack penetrations into the die region 210b during a die sawing. In embodiments, the spacing between the means 217 and the neighboring TSV 215 can be equal to about the width of each of the TSVs 215 or more. One of skill in the art can modify the dimensions of the means 217 and/or the TSVs 215 to desirably prevent ion diffusion and/or crack penetration.

Referring to FIG. 2C, the seal-ring structure 213 can continuously extend around the interconnect structure 219. In other embodiments, the seal-ring structure 213 can include a plurality of island structures, round structures, rectangular structures, other shape structures, and/or combinations thereof.

Referring to FIG. 2D, the bump structure 218 can include at least one inside bump 218a and at least one outside bump 218b. The inside bumps 218a are capable of providing electrically coupling with the die 220. The outside bump 218b can be coupled between the seal-ring structure 213 and the bump structure 240 to prevent ions diffusion and/or crack penetration into the die regions during a die sawing. In embodiments, the outside bump 218b can continuously extend around the inside bumps 218a. The outside bump 218b can be wider than the means 217 and/or the seal-ring structure 213. In embodiments, the seal-ring structure 213 can have a width between about 2 μm and about 10 μm, the means 217 can have a width between about 2 μm and about several hundred microns, and the outside bump 218b can have a width between about 10 μm and about several hundred microns. In other embodiments, the outside bump 218b can have a width between about 15 μm and about 80 μm. In still other embodiments, the spacing between the outside bump 218b and a neighboring bump 218a can be about equal to the width of one of the inside bumps 218a or more. The spacing between the means 217 and a neighboring TSV 215 can be about equal to the width of one of the TSVs 215. It is noted that one of skill in the art can modify the dimensions and numbers of the seal-ring structure 213, means 217, and/or the bump structure 218 to achieve a desired stacked structure for substantially preventing ion diffusion and/or crack penetration.

Referring to FIG. 2A again, the bump structures 238, 250, the means 217, and the seal-ring structure 213 can desirably prevent ion diffusion and/or crack penetration into the substrate region 210b from the scribe lines during a sawing process. Similarly, the bump structures 218, 240, the means 227, and the seal-ring structure 223 can desirably protect the substrate region 220b The means 237 and the seal-ring structure 233 can protect the substrate region 230b.

Figure 3A:
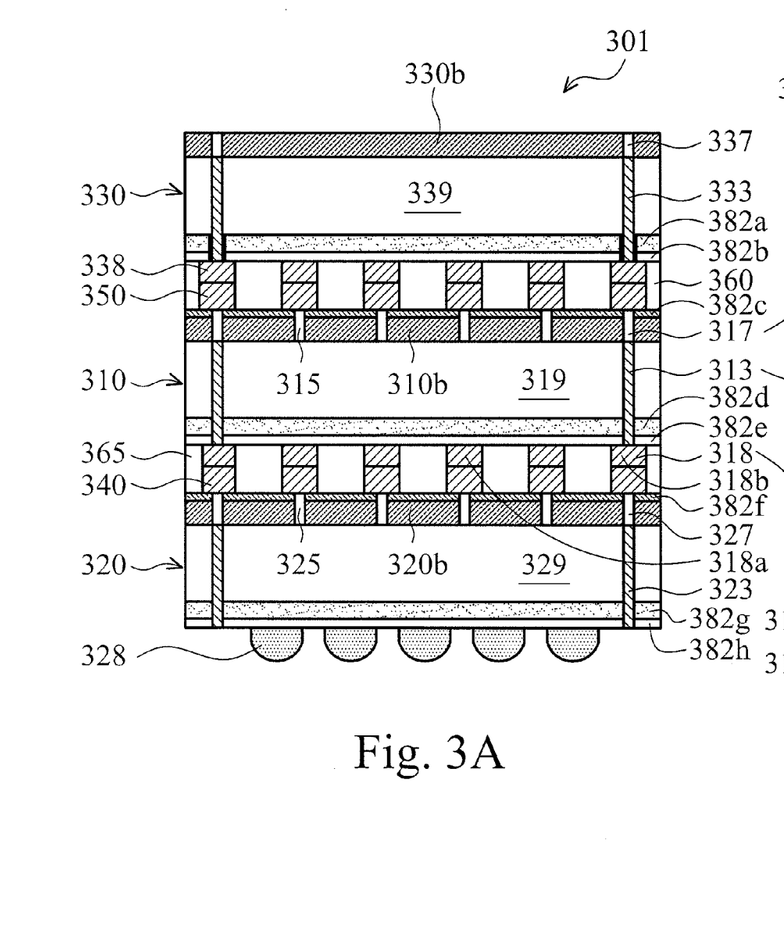
FIG. 3A is a schematic cross-sectional view of another exemplary back-to-front stacked structure.
Figure 3B:
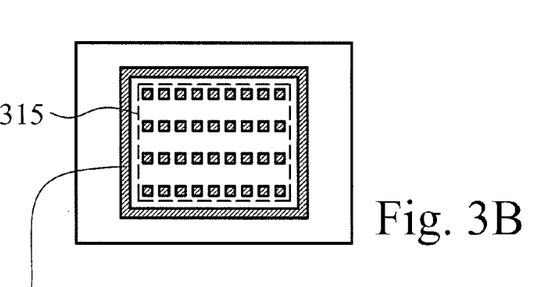
FIGS. 3B-3D are schematic top views of exemplary TSV layer, seal-ring structure layer, and bump structure layer of the stacked structure shown in FIG. 3A.
Figure 3C:
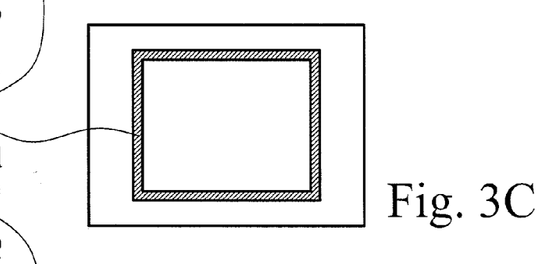
Figure 3D:
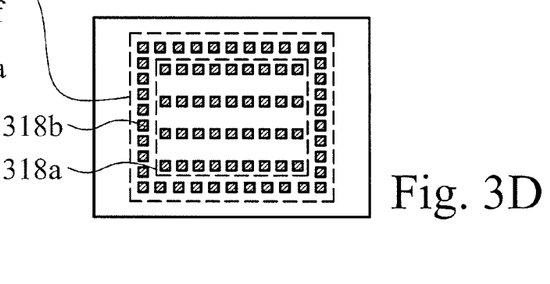

FIG. 3A is a schematic cross-sectional view of another exemplary back-to-front stacked structure. FIGS. 3B-3D are schematic top views of exemplary TSV layer, seal-ring structure layer, and bump structure layer of the stacked structure shown in FIG. 3A. Items of FIGS. 3A-3D that are the same items in FIGS. 2A-2B are indicated by the same reference numerals, increased by 100. In FIG. 3A, a stacked structure 301 includes a plurality of stacked dies 310, 320, and 330. A lower surface of the die 330 has one or more passivation layers 382a and 382b; an upper surface and a lower surface of the die 310 have one or more passivation layers 382c, 382d, and 382e; and an upper surface and a lower surface of the die 320 have one or more passivation layers 382f, 382g, and 382h.

Referring to FIGS. 3A-3B, the means 317 for substantially preventing ion diffusion can be coupled with the seal-ring structure 313, continuously extending around the TSVs 315.

The means 317 and the seal-ring structure 313 can desirably prevent ions diffusion and/or crack penetrations into the die region 310*b* during a die sawing. In embodiments, the spacing between the means 317 and the neighboring TSV 315 can be equal to about the width of each of the TSVs 315 or more. One of skill in the art can modify the dimensions of the means 317 and/or the TSVs 315 to desirably prevent ion diffusion and/or crack penetration.

In FIG. 3D, the bump structure 318 can include the inside bumps 318*a* and outside bumps 318*b*. The inside bumps 318*a* are capable of providing electrically coupling with the die 320. The outside bumps 318*b* can be coupled between the seal-ring structure 313 and at least one of the bumps of 340 to prevent ions diffusion into and/or crack penetration into the die region 320*b* during a die sawing. In embodiments, the outside bumps 318*b* can include a plurality of island bumps, round bumps, rectangular bumps, other shape bumps, and/or combinations thereof. In embodiments, the spacing between two of the bumps 318 can be about equal to the width of each of the bumps 318 or more.

Figure 4A:
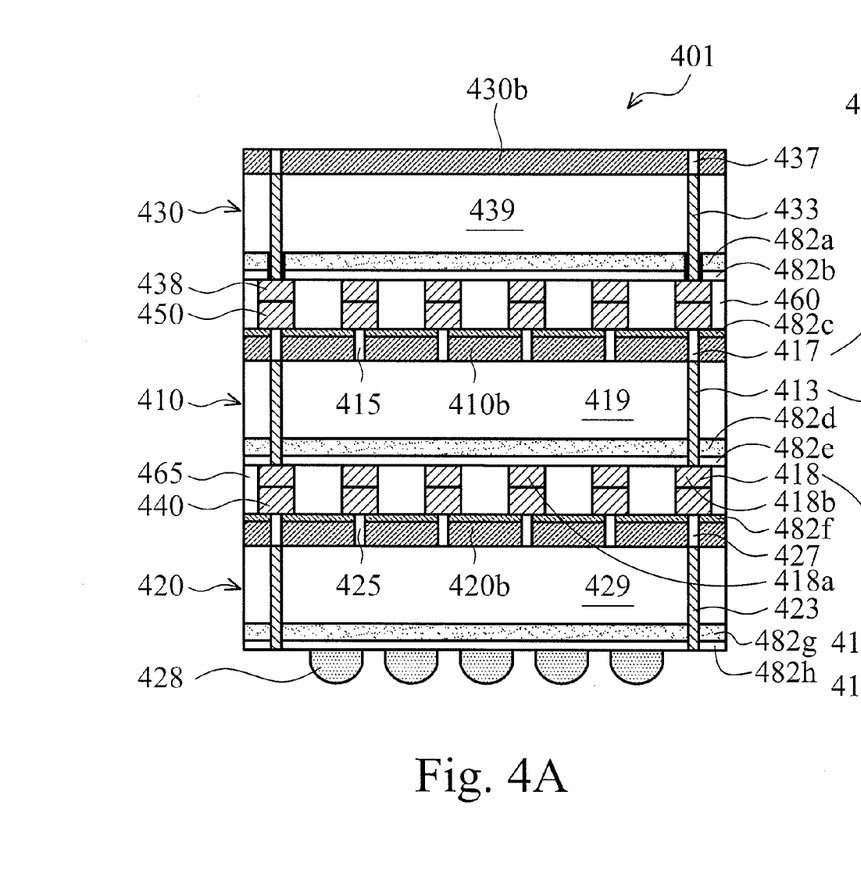
FIG. 4A is a schematic cross-sectional view of the other exemplary back-to-front stacked structure.
Figure 4B:
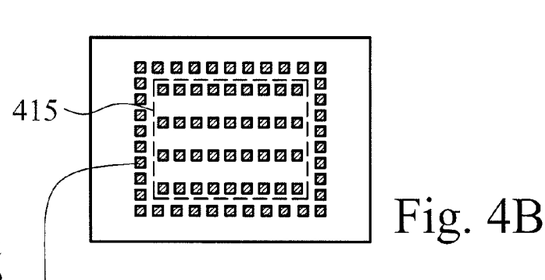
FIGS. 4B-4D are schematic top views of exemplary TSV layer, seal-ring structure layer, and bump structure layer of the stacked structure shown in FIG. 4A.
Figure 4C:
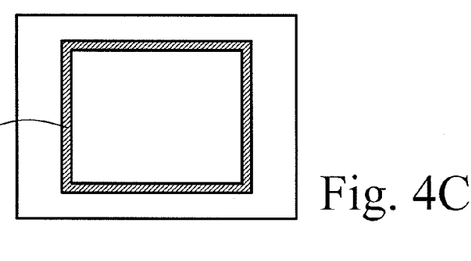
Figure 4D:
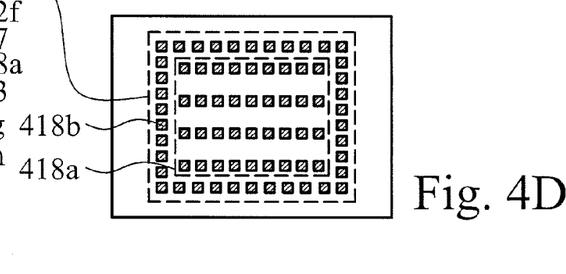

FIG. 4A is a schematic cross-sectional view of the other exemplary back-to-front stacked structure. FIGS. 4B-4D are schematic top views of exemplary TSV layer, seal-ring structure layer, and bump structure layer of the stacked structure shown in FIG. 4A. Items of FIGS. 4A-4D that are the same items in FIGS. 2A-2B are indicated by the same reference numerals, 15 increased by 200. In FIG. 4A, a stacked structure 401 includes a plurality of stacked dies 410, 420, and 430. A lower surface of the die 430 has one or more passivation layers 482*a* and 482*b*; an upper surface and a lower surface of the die 420 have one or more passivation layers 482*c*, 482*d*, and 482*e*; and an upper surface and a lower surface of the die 410 have one or more passivation layers 482*f*, 482*g*, and 482*h*.

In FIG. 4B, the means 417 can be disposed around the TSVs 415. The means 417 can include at least one via structure, through-silicon-via structure, trench structure, plug, other structure that is capable of substantially preventing ion diffusion, and/or combinations thereof. The shape of the top view of the means 417 can be round, oval, rectangular, triangular, hexangular, octangular, other suitable shape, and/or combinations thereof. In embodiments, the spacing between the means 417 and a neighboring TSV 415 can be about equal to the width of each of the TSVs 415 or more.

In FIG. 4D, the bump structure 418 can include the inside bumps 418*a* and outside bumps 418*b*. The inside bumps 418*a* are capable of providing electrically coupling with the die 420. The outside bump 418*b* can be coupled between the seal-ring structure 413 and at least one of the bumps of 440 to prevent ions diffusion and/or crack penetrations into the die regions during a die sawing. In embodiments, the outside bumps 418*b* can include a plurality of island bumps, round bumps, rectangular bumps, other shape bumps, and/or combinations thereof. In embodiments, the spacing between two of the bumps 418 can be about equal to the width of each of the bumps 418 or more.

Figure 5A:
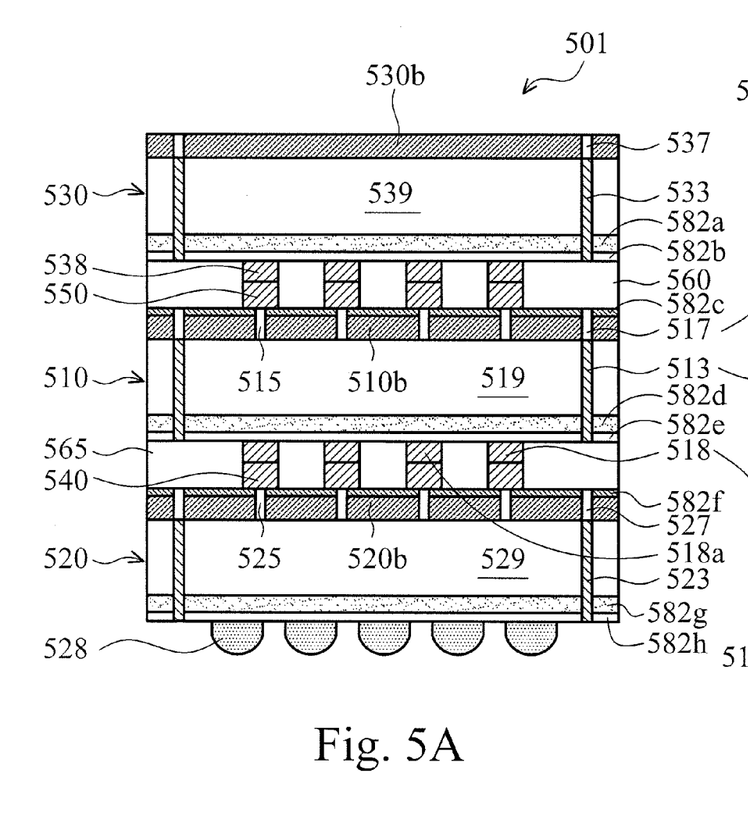
FIG. 5A is a schematic cross-sectional view of an exemplary back-to-front stacked structure.
Figure 5B:
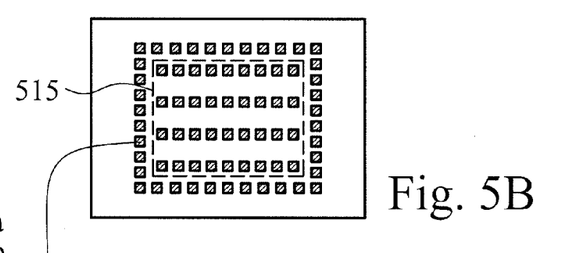
FIGS. 5B-5D are schematic top views of exemplary TSV layer, seal-ring structure layer, and bump structure layer of the stacked structure shown in FIG. 5A.
Figure 5C:
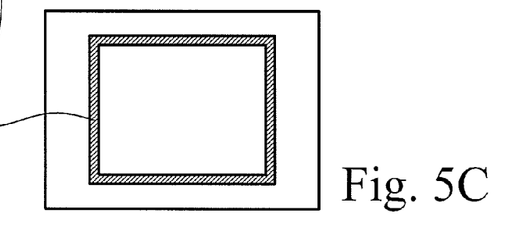
Figure 5D:
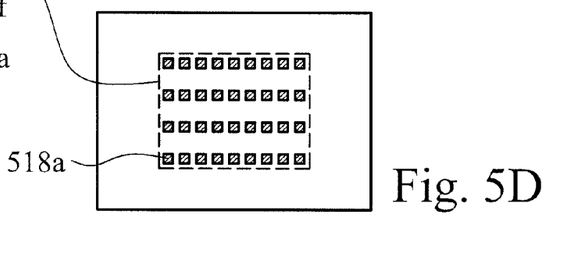

FIG. 5A is a schematic cross-sectional view of an exemplary back-to-front stacked structure. FIGS. 5B-5D are schematic top views of exemplary TSV layer, seal-ring structure layer, and bump structure layer of the stacked structure shown in FIG. 5A. Items of FIGS. 5A-5D that are the same items in FIGS. 2A-2B are indicated by the same reference numerals, increased by 300. In FIG. 5A, a stacked structure 501 includes a plurality of stacked dies 510, 520, and 530. A lower surface of the die 530 has one or more passivation layers 582*a* and 582*b*; an upper surface and a lower surface of the die 520 have one or more passivation layers 582*c*, 582*d*, and 582*e*; and an upper surface and a lower surface of the die 510 have one or more passivation layers 582*f*, 582*g*, and 582*h*.

In FIG. 5B, the means 517 can be disposed around the TSVs 515. The means 517 can include at least one via structure, through-silicon-via structure, trench structure, plug, other structure that is capable of substantially preventing ion diffusion, and/or combinations thereof. The shape of the top view of the means 517 can be round, oval, rectangular, triangular, hexangular, octangular, other suitable shape, and/or combinations thereof.

In FIG. 5D, the bump structure 518 can only include the inside bumps 518*a*. The inside bumps 518*a* are capable of providing electrically coupling with the die 520. As shown, the seal-ring structure 513 of the die 510 can be spaced from the means 527 of the die 520 by the underfill material 565. The underfill 565, the means 527, and the seal-ring structure 523 can provide a desired protection for the die region 520*b* during a die sawing. Similarly, the underfill 560, the means 517, and the seal-ring structure 513 can provide protect the die region 510*b* from ion diffusion and/or crack penetration during a die sawing.

Figure 6A:
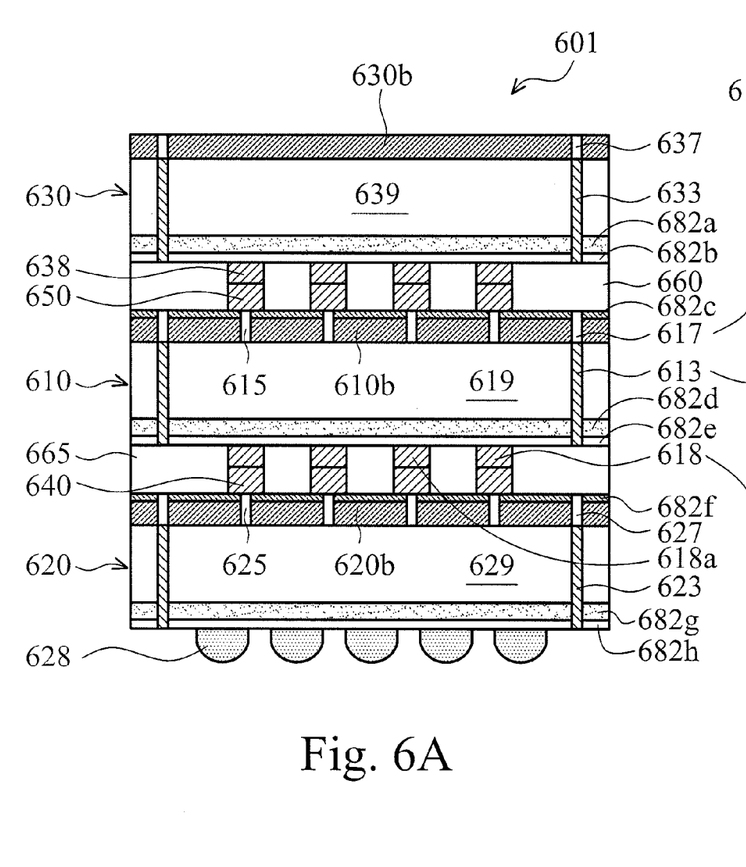
FIG. 6A is a schematic cross-sectional view of an exemplary back-to-front stacked structure.
Figure 6B:
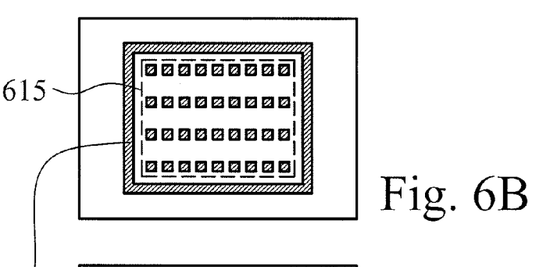
FIGS. 6B-6D are schematic top views of exemplary TSV layer, seal-ring structure layer, and bump structure layer of the stacked structure shown in FIG. 6A.
Figures 6C, 6D:
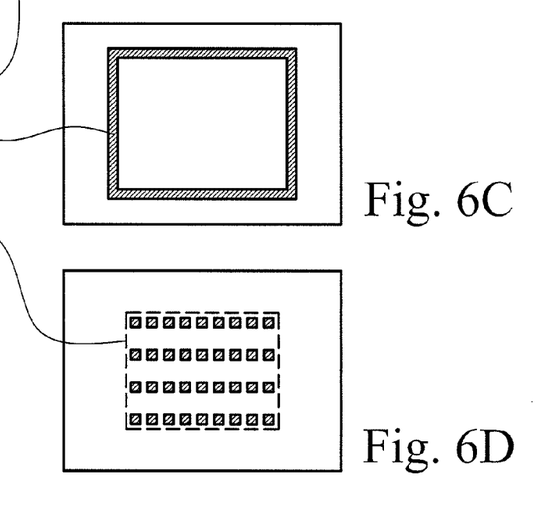

FIG. 6A is a schematic cross-sectional view of an exemplary back-to-front stacked structure 601. FIGS. 6B-6D are schematic top views of exemplary TSV layer, seal-ring structure layer, and bump structure layer of the stacked structure shown in FIG. 6A. Items of FIGS. 6A-6D that are the same items in FIGS. 2A-2B are indicated by the same reference numerals, increased by 400. In FIG. 6A, a stacked structure 601 includes a plurality of stacked dies 610, 620, and 630. A lower surface of the die 630 has one or more passivation layers 682*a* and 682*b*; an upper surface and a lower surface of the die 620 have one or more passivation layers 682*c*, 682*d* and 682*e*; and an upper surface and a lower surface of the die 610 have one or more passivation layers 682*f*, 682*g*, and 682*h*.

Referring to FIGS. 6A-6B, the means 617 for substantially preventing ion diffusion can be coupled with the seal-ring structure 613, continuously extending around the TSVs 615. The means 617 and the seal-ring structure 613 can desirably prevent ions diffusion and/or crack penetrations into the die region 610*b* during a die sawing. In embodiments, the spacing between the means 617 and a neighboring TSV 615 can be equal to about the width of each of the TSVs 615 or more.

In FIG. 6D, the bump structure 618 can only include the inside bumps 618*a*. The inside bumps 618*a* are capable of providing electrically coupling with the die 620. As shown, the seal-ring structure 613 of the die 610 can be spaced from the means 627 of the die 620 by the underfill material 665. The underfill material 665, the means 627, and the seal-ring structure 623 can provide a desired protection for the die region 620*b* during a die sawing. Similarly, the underfill material 660, the means 617, and the seal-ring structure 613 can provide protect the die region 610*b* from ion diffusion and/or crack penetration during a die sawing.

It is noted that the dies and stacked structures described above in conjunction with FIGS. 1-6 can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die comprising:
   an interconnect structure:
   a substrate over the interconnect structure, the substrate having a substrate region defined therein, the substrate region being defined according to a die region of the die, the substrate being a semiconductor substrate;
   a seal-ring structure in the interconnect structure positioned below the substrate, wherein, in a plan view, the seal-ring structure contacts the substrate at a location around a periphery of the die region; and
   at least one means for substantially preventing ion diffusion into the substrate region, the at least one means being in direct contact with the seal-ring structure.

2. The die of claim 1, wherein the at least one means comprises a via structure.

3. The die of claim 2, wherein the via structure has a height that is substantially equal to or greater than one-half of a thickness of the substrate.

4. The die of claim 2, wherein the via structure comprises a through-silicon-via (TSV) structure.

5. The die of claim 2, wherein the substrate has at least one through-silicon-via (TSV) structure positioned within the substrate region, and the via structure comprises a plurality of vias disposed around the at least one through-silicon-via (TSV) structure.

6. The die of claim 1, wherein the substrate has at least one through-silicon-via (TSV) structure positioned within the substrate region, and the at least one means continuously extends around the at least one through-silicon-via (TSV) structure.

7. A stacked structure comprising:
   a first die including
   an interconnect structure:
      a first substrate over the interconnect structure, the first substrate having a first substrate region defined therein, the first substrate region being defined according to a first die region of the first die, the first substrate being a first semiconductor substrate;
      a first seal-ring structure in the interconnect structure positioned below the first substrate, wherein, in a plan view, the first seal-ring structure contacts the first substrate at a location around a periphery of the first die region; and
      at least one first means for substantially preventing ion diffusion into the first substrate region, the at least one first means being in direct contact with the first seal-ring structure; and
   a second die electrically coupled with the first die.

8. The stacked structure of claim 7, wherein the second die comprises:
   a second substrate having a second substrate region defined therein, the second substrate region being defined according to a second die region of the second die, the second substrate being a second semiconductor substrate;
   a second seal-ring structure positioned below the second substrate, the second seal-ring structure being around the second die region; and
   at least one second means for substantially preventing ions from diffusing into the second substrate region, the at least one second means being coupled with the second seal-ring structure.

9. The stacked structure of claim 8, wherein each of the first and second means comprises a via structure.

10. The stacked structure of claim 9, wherein the via structure of the first means has a height that is substantially equal to or greater than one-half of a thickness of the first substrate, and the via structure of the second means has a height that is substantially equal to or greater than one-half of a thickness of the second substrate.

11. The stacked structure of claim 10, wherein the via structure comprises a through-silicon-via (TSV) structure.

12. The stacked structure of claim 9, wherein the first substrate has at least one through-silicon-via (TSV) structure positioned within the first substrate region, and the via structure of the first means comprises a plurality of vias disposed around the at least one through-silicon-via (TSV) structure.

13. The stacked structure of claim 8, wherein the first substrate has at least one through-silicon-via (TSV) structure positioned within the first substrate region, and the first means continuously extends around the at least one through-silicon-via (TSV) structure.

14. The stacked structure of claim 8, wherein the first die further comprises at least one first bump structure coupled with the first seal-ring structure, the second die further comprises at least one second bump structure coupled with the at least one second means, and the at least one first bump structure is coupled with the at least one second bump structure.

15. The stacked structure of claim 14, wherein at least one of the first bump structure and the second bump structure continuously extends around the first die region or the second die region.

16. The stacked structure of claim 14, wherein at least one of the first bump structure and the second bump structure includes a plurality of bumps around the first die region or the second die region.

17. The stacked structure of claim 8, wherein the at least one first seal-ring structure is spaced from the at least one second means by an underfill material.

18. A system comprising:
   a substrate board; and
   a stacked structure being electrically coupled with the substrate board, wherein the stacked structure comprises:
      a first die comprising:
      an interconnect structure;
         a first substrate over the interconnect structure, the first substrate having a first substrate region defined therein, the first substrate region being defined according to a first die region of the first die, the first substrate being a first semiconductor substrate;
         a first seal-ring in the interconnect structure structure positioned below the first substrate, wherein, a plan view, the first seal-ring structure contacts the first substrate at a location around a periphery of the first die region; and
         at least one first means for substantially preventing ion diffusion into the first substrate region, the at least one first means being in direct contact with the first seal-ring structure; and
      a second die electrically coupled with the first die.

19. The system of claim 18, wherein the second die comprises:
   a second substrate having a second substrate region defined therein, the second substrate region being defined according to a second die region of the second die, the second substrate being a second semiconductor substrate;

a second seal-ring structure positioned below the second substrate, the second seal-ring structure contacting the second substrate at a location around the second die region; and at least one second means for substantially preventing ions from diffusing into the second substrate region, the at least one second means being coupled with the second seal-ring structure.

20. The system of claim 18, wherein the at least one first means comprises a TSV structure.

21. A die comprising:

an interconnect structure;

a substrate formed over the interconnect structure, the substrate having a substrate region defined therein, the substrate region being defined according to a die region of the die, the substrate being a semiconductor substrate;

a seal-ring structure formed in the interconnect structure, wherein, in a plan view, the seal-ring structure contacts the substrate at a location around a periphery of the die region; and a via structure formed in the substrate and in contact with the seal-ring structure.

22. The die of claim 21, wherein the via structure comprises a plurality of via structures spaced along the seal-ring structure.

23. The die of claim 21, wherein the via structure comprises a filled trench extending along the seal-ring structure.

* * * * *